(12) United States Patent
Jakli et al.

(10) Patent No.: US 7,832,093 B2
(45) Date of Patent: Nov. 16, 2010

(54) METHOD OF CREATING AN ELECTRO-MECHANICAL ENERGY CONVERSION DEVICE

(75) Inventors: Antal I. Jakli, Kent, OH (US); John Ernest Harden, Jr., Streetsboro, OH (US); Samuel Sprunt, Hudson, OH (US); James T. Gleeson, Kent, OH (US); Peter Palffy-Muhoray, Kent, OH (US)

(73) Assignee: Kent State University, Kent, OH (US)

( * ) Notice: Subject to any disclaimer, the term of this patent is extended or adjusted under 35 U.S.C. 154(b) by 296 days.

(21) Appl. No.: 11/761,027

(22) Filed: Jun. 11, 2007

(65) Prior Publication Data

US 2008/0303376 A1 Dec. 11, 2008

(51) Int. Cl.
*H05K 3/20* (2006.01)
(52) U.S. Cl. .................. 29/831; 29/592.1; 310/311; 310/329; 324/727; 428/689
(58) Field of Classification Search ............... 29/592.1, 29/831; 310/311, 319; 324/727; 428/689
See application file for complete search history.

(56) References Cited

U.S. PATENT DOCUMENTS 4,589,733 A * 5/1986 Yaniv et al. .................. 349/54
5,612,387 A * 3/1997 Ogawa ................... 156/274.4
7,229,663 B2 * 6/2007 Stephenson et al. ......... 427/162

OTHER PUBLICATIONS

I. Wirth, S. Diele, A. Eremin, G. Pelzl, S. Grande, L. Kovalenko, N. Pancenko, W. Weissflog, "New variants of polymorphism in banana-shaped mesogens with cyano-substituted central core," J. Mater. Chem., 11, 1642-1650 (2001).
W. Weissflog, H. Nadasi, U. Dunemann, G. Pelzl, S. Diele, A. Eremin, H. Kresse, "Influence of lateral substituents on the mesophase behaviour of banana-shaped mesogens," J. Mater. Chem., 11, 2748-2758 (2001).
J. Harden, B. Mbanga, N. Eber, K. Fodor-Csorba, S. Sprunt, J.T. Gleeson, A. Jakli, "Giant flexoelectricity of bent-core nematic liquid crystals," Phys. Rev. Lett., 97, 157802-1-4, (2006).
C. D Richards et al J. Micromech. Microeng., 14, 717-721 (2004).

(Continued)

*Primary Examiner*—Paul D Kim
(74) *Attorney, Agent, or Firm*—Hahn Loeser + Parks LLP; Scott M. Oldham, Esq.

(57) ABSTRACT

There are provided methods for creating energy conversion devices based on the giant flexoelectric effect in non-calamitic liquid crystals. By preparing a substance comprising at least one type of non-calamitic liquid crystal molecules and stabilizing the substance to form a mechanically flexible material, flexible conductive electrodes may be applied to the material to create an electro-mechanical energy conversion device which relies on the giant flexoelectric effect to produce electrical and/or mechanical energy that is usable in such applications as, for example, power sources, energy dissipation, sensors/transducers, and actuators.

18 Claims, 14 Drawing Sheets

OTHER PUBLICATIONS

S. Warrier, N. V. Madhusudana, J. Phys. II (France), 7, 1789 (1997).

L. M. Blinov, M. I. Barnik, H. Ohoka, M. Ozaki, K. Yoshino, Phys. Rev. E., 64, 031707 (2001).

D. B. Wiant, J. T. Gleeson, N. Eber, K. Fodor-Csorba, A. Jakli, T. Toth-Katona, "Non-Standard Electroconvection in a Bent Core Nematic," Phys. Rev. E., 72, 041712 (2005).

D. Wiant, S. Stojadinovic, K. Neupane, S. Sharma, K. Fodor-Csorba, A. Jalki, J. T. Gleeson, and S. Sprunt, "Critical behavior at the isotropic to nematic phase transition in a bent-core liquid crystal," Phys. Rev. E., 73, 030703 (R) (2006).

K. Fodor-Csorba, A. Vajda, G. Galli, A. Jakli, D. Demus, S. Holly, and E. Gacs-Baitz, Macromol. Chem. Phys., 203, 1556 (2002).

A. Mazzulla, F. Ciuchi, J. R. Sambles, Phys. Rev. E., 64, 021708 (2001).

R. B. Meyer, Phys. Rev. Lett., "Piezoelectric effects in liquid crystals," 22, 918-921 (1969).

J. Matraszek, J. Mieczkowski, J. Szydlowska, E. Gorecka, "Nematic phase formed by banana-shaped molecules," Liq. Cryst., 27, 429-436 (2000).

E. Matyus, K. Keseru, "Synthesis, characterization and theoretical considerations of a novel class of banana-shaped compounds with liquid crystal properties," J. Mol. Struct., 543, 89 (2001).

T. J. Dingemans, E. T. Samulski, "Non-linear boomerang-shaped liquid crystals derived from 2,5-bis(p-hydroxyphenyl)-1,3,4-oxadiazole," Liq. Cryst., 27, 131-136 (2000).

W. Helfrich, Phys. Lett., 35A, 393 (1971).

A. Derzhanski, A. G. Petrov, Phys. Lett., 36A, 483 (1971).

G. Barbero, P. Taverna Valabrega, R. Bartolino, B. Valenti, Liq. Cryst., 1, 483 (1986).

B. Valenti, C. Bertoni, G. Barbero, P. Taverna Valabrega, R. Bartolino, Mol. Cryst. Liq. Cryst., 146, 307 (1987).

I. Dozov, Ph. Martinot-Lagarde, G. Durand, J. Phys. Lett., (Paris), 43, L-365 (1982).

N. T. Kirkman, T. Stirner, W. E. Hagston, Liq. Cryst., 30, 1115 (2003).

S. Ponti, P. Ziherl, C. Ferrero, S. Zumer, Liq. Cryst., 26, 1171 (1999).

T. Takahashi, S. Hashidate, H. Nishijou, M. Usui, M. Kimura, T. Akahane, Jpn. J. Appl. Phys., 37, 1865 (1998).

L. A. Beresnev, L. M. Blinov, S. A. Davidyan, S. G. Konov, S. B. Yablonskii, JETP Lett., 45, 755 (1987).

P. R. Mahesware Murthy, V. A. Ragunathan, N. V. Madhusudana, Liq. Cryst., 14, 483 (1993).

* cited by examiner

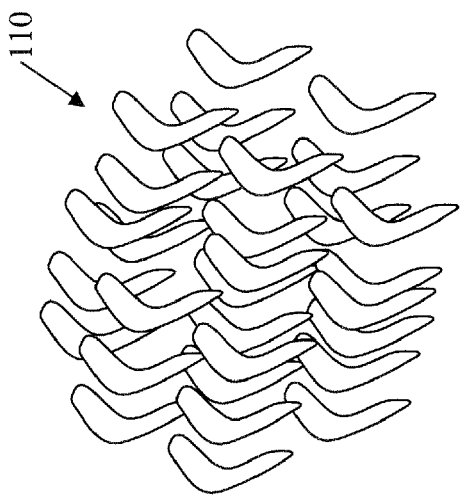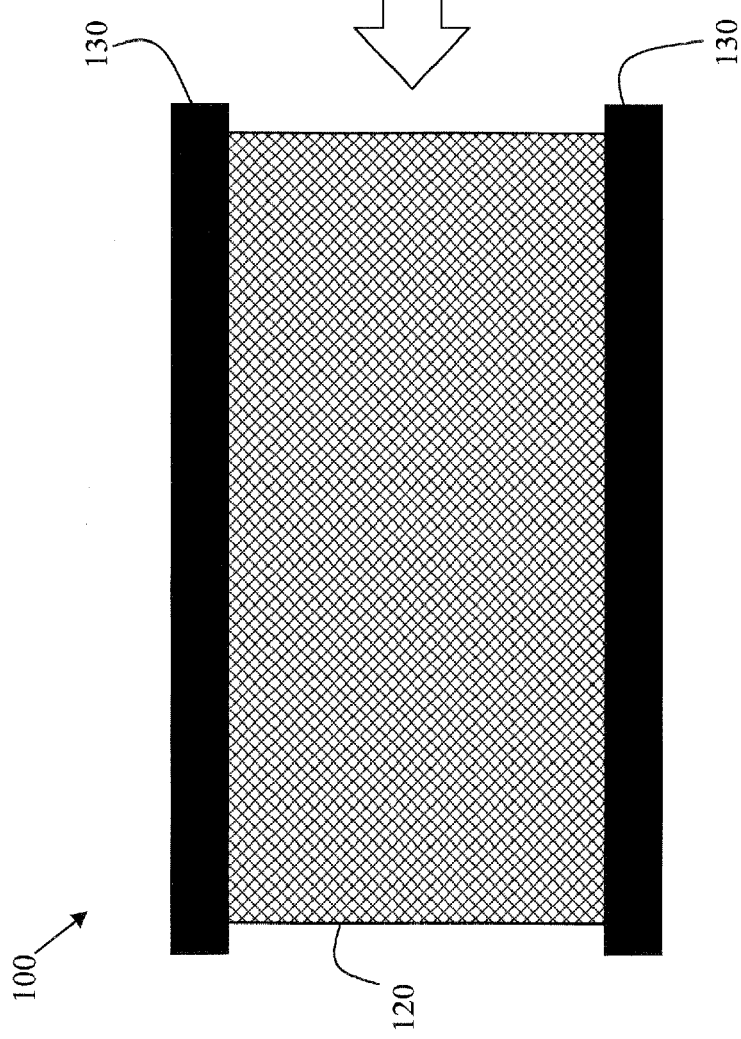

METHOD OF CREATING AN ELECTRO-MECHANICAL ENERGY CONVERSION DEVICE

GOVERNMENT SUPPORT

The U.S. Government has a paid-up license in this invention and the right in limited circumstances to require the patent owner to license others on reasonable terms as provided for by the terms of grant no. DMR-0606160 awarded by the National Science Foundation (NSF), and contract no. N00014-07-1-0440 awarded by the U.S. Navy/Office of Naval Research.

TECHNICAL FIELD

Certain embodiments of the present invention relate to electro-mechanical energy conversion devices and methods. More particularly, certain embodiments of the present invention relate to devices and methods for converting mechanical energy to electrical energy, and electrical energy to mechanical energy based on the giant flexoelectric effect observed in certain non-calamitic liquid crystal molecules.

BACKGROUND

Interconversion between different forms of energy is a crucial capability in a diverse range of technologies from interplanetary probes to nano-fabricated micro-electronic mechanical systems (MEMS) and everything in between. Flexoelectricity is a linear coupling between orientational deformation (caused by, for example, mechanical flexure) and electric polarization. Flexoelectricity is a unique property of orientationally ordered materials, of which nematic liquid crystals (NLCs) are the best known example. The original flexoelectric effect, or coupling between electric polarization and elastic flexure in NLCs was first predicted almost 40 years ago. For common calamitic (rod-shaped) liquid crystal molecules (the type of compound ubiquitous in liquid crystal display applications), the flexoelectric effect is very small and effectively unusable for many applications of, for example, electro-mechanical energy conversion.

To date, flexoelectric coefficients, which characterize the flexoelectric effect, have mainly been measured using indirect methods such as analyzing optical effects produced by electric field induced director distortions. Usually, hybrid aligned cells are used, where either the sum or difference (depending on the cell geometry) of the coefficients may be obtained. Such methods often require knowledge of various material parameters such as birefringence, dielectric and elastic constants, and anchoring energies which, ideally, should be independently measured. Published data on flexoelectric coefficients should be handled, however, with some care as various authors have obtained different values from the same experimental data sets using different evaluation techniques. This is perhaps not surprising given how small the coefficients are for calamitic NLCs.

Further limitations and disadvantages of conventional, traditional, and proposed approaches will become apparent to one of skill in the art, through comparison of such systems and methods with the present invention as set forth in the remainder of the present application with reference to the drawings.

BRIEF SUMMARY

An embodiment of the present invention comprises a method of creating an electro-mechanical energy conversion device. The method includes preparing a substance comprising at least one type of non-calamitic liquid crystal molecules and stabilizing the prepared substance to form a mechanically flexible material. The method further includes applying flexible conductive electrodes to the material.

Another embodiment of the present invention comprises an electro-mechanical energy conversion device. The device includes a stabilized substance comprising at least one type of non-calamitic liquid crystal molecules forming a mechanically flexible material, and at least two conductive electrodes applied to the material.

A further embodiment of the present invention comprises a method of determining a flexoelectric effect in a liquid crystal material. The method includes periodically flexing a stabilized layer of liquid crystal material interposed between non-rigid electrically conducting surfaces and measuring an induced electric current flowing between the conducting surfaces.

Another embodiment of the present invention comprises a system for determining a flexoelectric effect in a liquid crystal material. The system includes a test chamber having a fixed base and moveable side walls. The system also includes a driving mechanism capable of providing periodic motion and being mechanically coupled to the moveable side walls. The system further includes an amplifier electrically coupled to the driving mechanism to electrically drive the driving mechanism. The system also includes a signal generator electrically coupled to the amplifier to provide a signal of at least one audio frequency to the amplifier. The system further includes a current sensor for measuring an electric current induced in a liquid crystal material mechanically coupled to the moveable side walls of the test chamber.

A further embodiment of the present invention comprises a method of creating an electro-mechanical energy conversion device. The method includes preparing a substance comprising at least one type of non-calamitic liquid crystal molecules capable of exhibiting a giant flexoelectric effect. The method further includes stabilizing the prepared substance to form a mechanically flexible material and applying rigid conductive electrodes to the material.

Another embodiment of the present invention comprises an electro-mechanical energy conversion device. The device includes a stabilized substance comprising at least one type of non-calamitic liquid crystal molecules forming a mechanically flexible material capable of exhibiting a giant flexoelectric effect, and at least two rigid conductive electrodes applied to the material.

Devices employing the giant flexoelectric effect may be light weight, low cost, have dynamic shape conformability, allow for flexible packaging, provide larger areal coverage, have a low profile, and/or be human-person compatible.

These and other advantages and novel features of the present invention, as well as details of illustrated embodiments thereof, will be more fully understood from the following description and drawings.

BRIEF DESCRIPTION OF THE DRAWINGS

FIGS. 1A-1B are schematic illustrations of an embodiment of an energy conversion device and an embodiment of the non-calamitic liquid crystal molecules used in the device;

DETAILED DESCRIPTION

Figure 2:
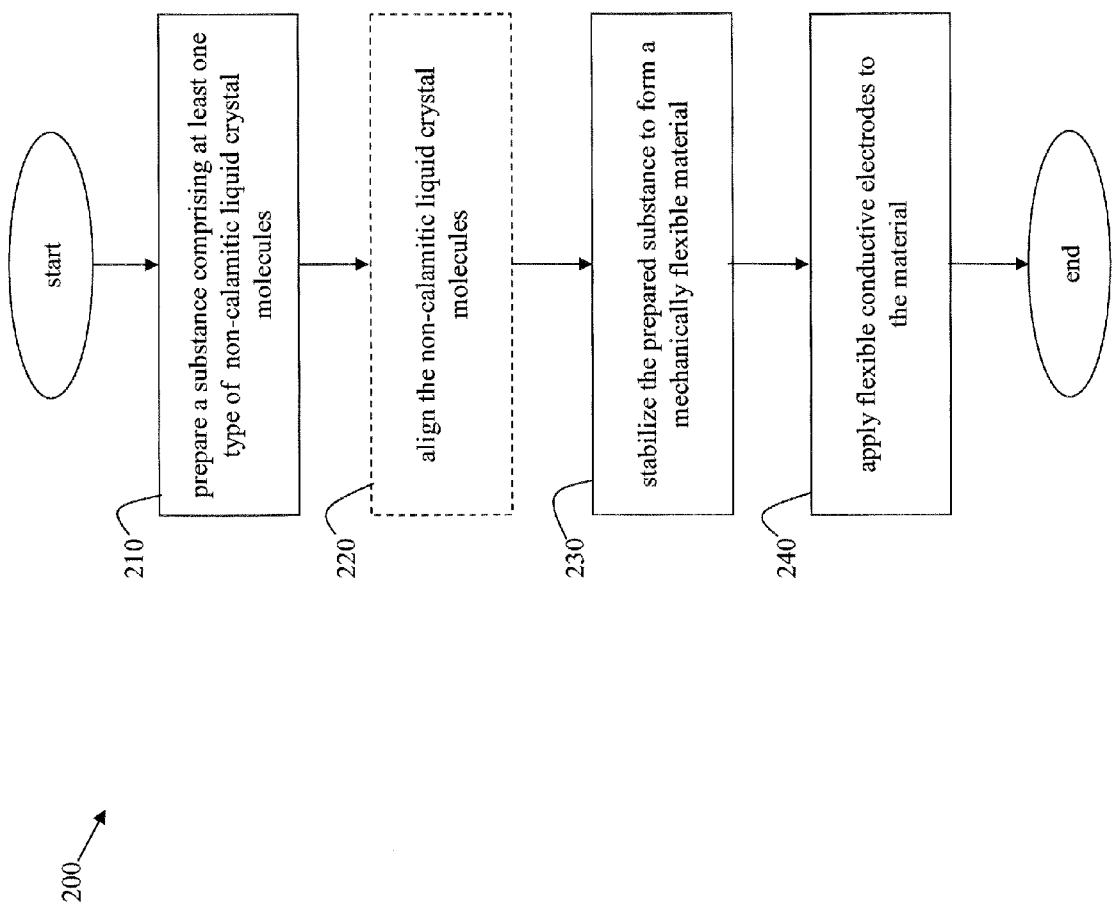
FIG. 2 is a flowchart of an embodiment of a method of creating an electro-mechanical energy conversion device.

FIGS. 1A-1B are schematic illustrations of an embodiment of an energy conversion device 100 and an embodiment of the non-calamitic liquid crystal molecules 110 used in the device 100, respectively. As used herein, the term non-calamitic refers to liquid crystal molecules that are not substantially rod-shaped. Such non-calamitic molecules may include non-calamitic nematic (i.e., the liquid crystal phase is nematic) liquid crystal molecules such as, for example, bent-core nematic liquid crystal (NLC) molecules (as shown in FIG. 1B) or pear-shaped nematic liquid crystal molecules, for example. Other types of non-calamitic liquid crystal molecules, which are not nematic and which exhibit the giant flexoelectric effect, may be possible as well.

One or more types of non-calamitic liquid crystal molecules 110 may be mixed together and used in the device 100. That is, at least one non-calamitic material is used in a mixture. For example, non-calamitic molecules may be mixed with calamitic molecules. Certain types of non-calamitic liquid crystal molecules may have one type of functional group and other types may have another type of functional group. Functional groups (or moieties) are specific groups of atoms within molecules that are responsible for the characteristic chemical reactions of those molecules such as, for example, covalent bonding or hydrogen bonding.

Certain, non-calamitic liquid crystal molecules have been discovered to exhibit a "giant flexoelectric effect". That is, certain non-calamitic liquid crystal molecules have been discovered to exhibit a flexoelectric effect at least two orders of magnitude greater than that exhibited by traditional calamitic (substantially rod-shaped) liquid crystal molecules, making energy conversion devices using such non-calamitic liquid crystal molecules practical. Other non-calamitic liquid crystal molecules (other than bent-core or pear-shaped) which exhibit the giant flexoelectric effect are possible as well but may have yet to be discovered, developed, or characterized for their giant flexoelectric properties. The magnitude of the giant flexoelectric effect depends on the quantity of the molecules involved, the quality of the alignment of the molecules, and the efficiency of transmission of the flexing force to the molecules. In general, the flexoelectric effect is considered to be giant when it is larger than 1 nano-coulomb per meter (nC/m), which is about 100 times larger than 10 pico-coulombs per meter (pC/m) usually found in calamitic liquid crystal molecules.

The device 100 includes a substance, comprising at least the non-calamitic liquid crystal molecules 110, which is stabilized to form a mechanically flexible material 120 (i.e., a stabilized substance) and at least two flexible conductive electrodes 130 applied to the flexible material 120. In such a configuration, the device 100 may be mechanically flexed, producing a potential difference between the electrodes 130. Alternatively, a potential difference may be applied to the electrodes 130, resulting in a flexing of the device 100. Both the material 120 and the electrodes 130 flex together such that the electrodes 130 do not separate from the material 120.

In a non-stabilized state, the non-calamitic liquid crystal molecules 110 are fluidic and are not ideally suitable for energy conversion devices. In order to exploit the giant flexoelectric properties and create a material sufficiently rugged for use, the non-calamitic liquid crystal molecules 110 are encapsulated or stabilized, using a variety of possible techniques, into a polymer matrix. Such stabilization techniques are described later herein in further detail. The polymer matrix helps to provide more direct coupling of the external flexing action to the molecules. The resultant stabilized material may have the consistency of a soft, rubbery product, such that the material may be easily mechanically deformed to produce electricity, yet is not a liquid which has to be confined to maintain a desired shape.

The electrodes may comprise conductive material and are, for example, deposited onto the flexible material 120. Other methods of applying the flexible electrodes 130 to the flexible material 120 are possible as well, as may be known in the art, in accordance with other various embodiments of the present invention. Examples of such conductive materials include electrically conducting polymers, conductive grease, nano-wire mesh, nano-fibers, and conductive metals.

FIG. 2 is a flowchart of an embodiment of a method 200 of creating an electro-mechanical energy conversion device 100. In step 210, prepare a substance comprising at least one type of non-calamitic liquid crystal molecules 110. In optional step 220, align the non-calamitic liquid crystal molecules 110. The aligning is done such that a direction of average molecular anisotropy in an undistorted (unflexed) state is uniform across the non-calamitic liquid crystal molecules 110. Aligning may be performed by applying a surface treatment such as by rubbing, applying a mechanical deformation, or applying external electric and/or magnetic fields as is known in the art. In step 230, stabilize the prepared substance to form a mechanically flexible material 120. Again, such stabilization techniques are described later herein in further detail. In step 240, apply flexible conductive electrodes 130 to the flexible material 120.

Figure 3A:
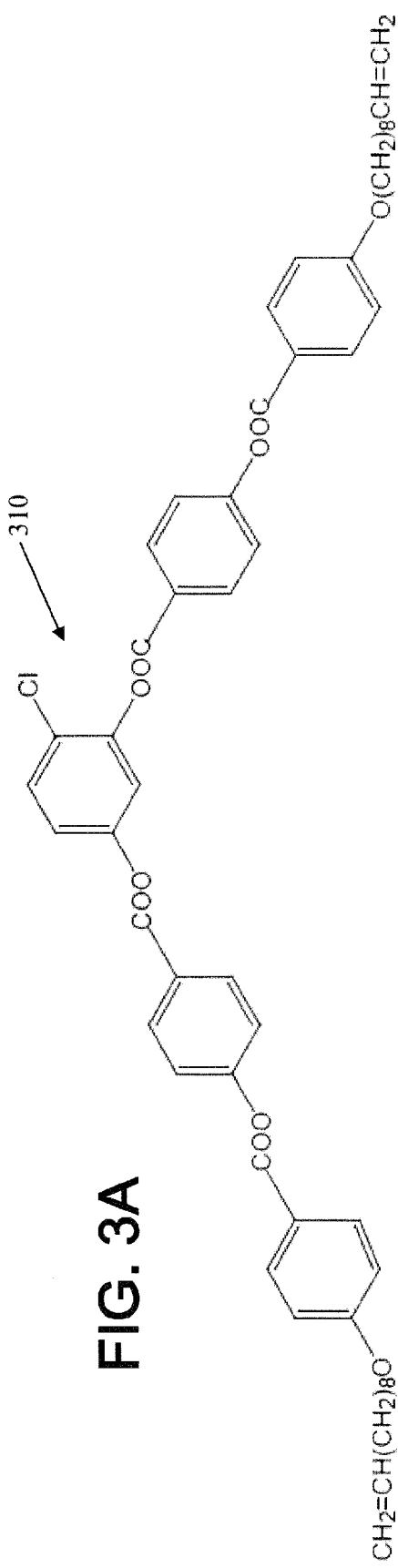
FIG. 3A is a chemical diagram of a first embodiment of a non-calamitic nematic liquid crystal molecule exhibiting the giant flexoelectric effect.
Figure 3B:
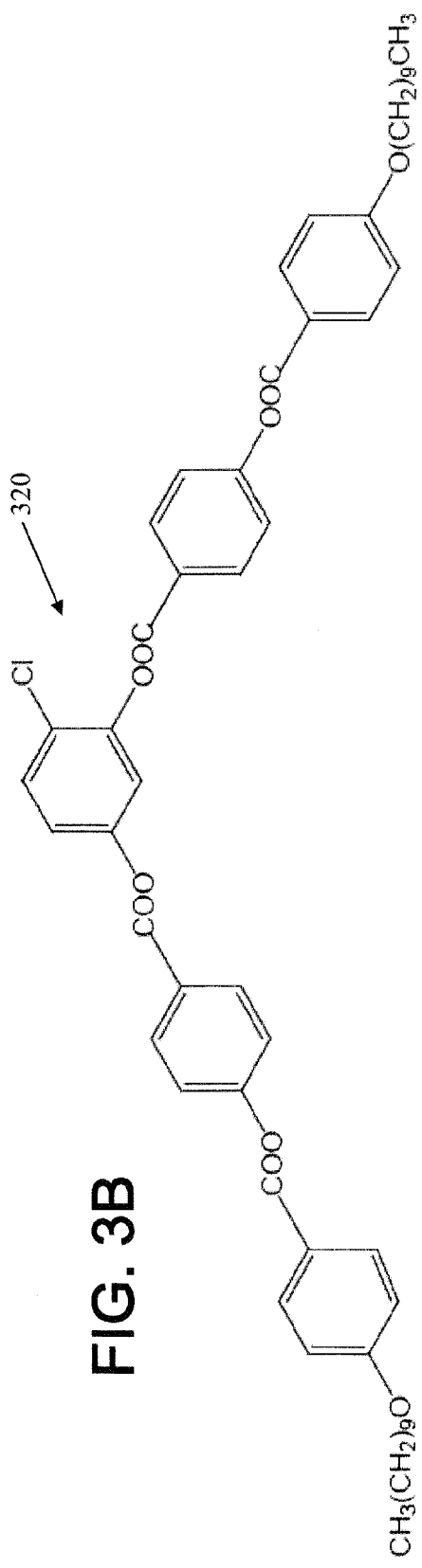
FIG. 3B is a chemical diagram of a second embodiment of a non-calamitic nematic liquid crystal molecule exhibiting the giant flexoelectric effect.

FIG. 3A is a chemical diagram of a first embodiment of a non-calamitic nematic liquid crystal molecule 310 exhibiting the giant flexoelectric effect. The molecule 310 is known as CLPbis10BB and was the first non-calamitic NLC molecule observed to exhibit the giant flexoelectric effect. Notice the bent-core shape of the molecule 310 in the diagram. Similarly, FIG. 3B is a chemical diagram of a second embodiment of a non-calamitic nematic liquid crystal molecule 320 exhibiting the giant flexoelectric effect. The molecule 320 is the saturated version of the molecule 310 (CLPbis10BB) and has been measured to have a flexoelectric effect being about 50% greater than that of CLPbis10BB.

Figure 4:
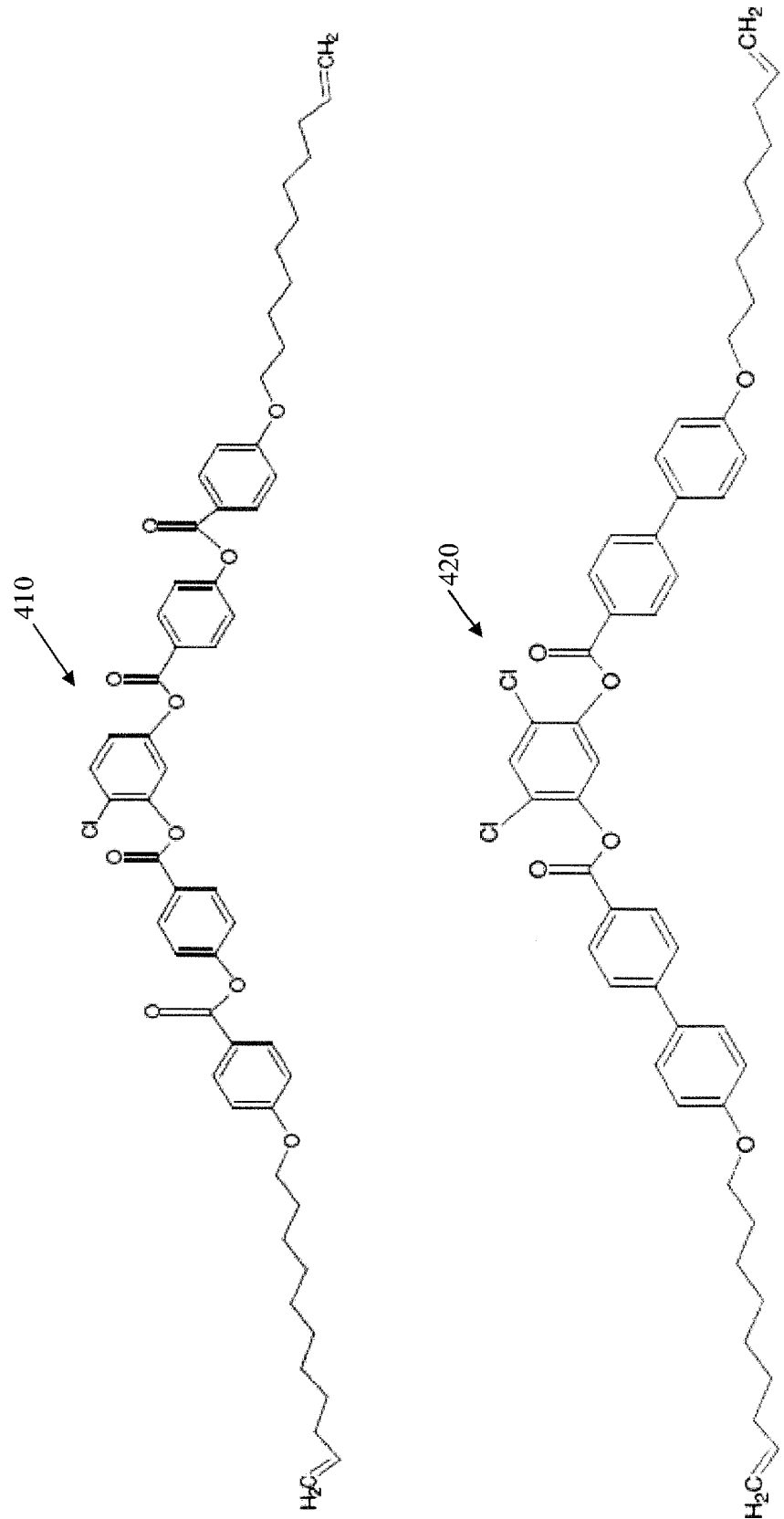
FIG. 4 is a chemical diagram of an embodiment of two non-calamitic nematic liquid crystal molecules which, when mixed together, exhibit the giant flexoelectric effect at room temperature.

FIG. 4 is a chemical diagram of an embodiment of two non-calamitic nematic liquid crystal molecules 410 and 420 which, when mixed together during preparation and then stabilized, exhibit the giant flexoelectric effect at room temperature. A mixture of about 50%/50% of these two molecules 410 and 420 exhibit a room temperature nematic liquid crystal phase having an isotropic to nematic (I-N) transition at about 85° C.

The process of stabilizing the non-calamitic liquid crystal molecules 110 involves forming a polymer mesh or matrix to encapsulate the molecules (at least to a certain degree). For example, in accordance with an embodiment of the present invention, the step 230 of stabilizing the prepared substance includes initiating cross-linking between two or more functional groups of the non-calamitic liquid crystal molecules to form a polymer matrix of covalent bonds. That is, the polymer mesh is formed by the non-calamitic liquid crystal molecules themselves. Cross-linking may be initiated by, for example, photo-initiation, thermal processing, or catalysis. Not all of the molecules 110 within the substance have to be cross-linked. In reality, only a small portion (e.g., 5%) of the molecules 110 within the substance may be cross-linked, providing enough stabilization to allow effective production of the giant flexoelectric effect.

Similarly, for example, in accordance with another embodiment of the present invention, the step 230 of stabilizing the prepared substance includes initiating cross-linking between two or more functional groups of the non-calamitic liquid crystal molecules to form a polymer matrix of hydrogen bonds. Again, not all of the molecules 110 within the substance have to be cross-linked to provide enough stabilization to allow effective production of the giant flexoelectric effect.

In accordance with other embodiments of the present invention, compounds having reactive functional groups (i.e., reactive compounds) may be dissolved into the non-calamitic liquid crystal molecules 110 as part of the preparation step 210. Then, in the stabilization step 230, cross-linking is initiated between the reactive functional groups to form a polymer matrix of covalent or hydrogen bonds. The cross-linking of the compounds encapsulates and, therefore, stabilizes the non-calamitic liquid crystal molecules 110. Examples of such compounds include vinyls, epoxides, and polymers of perfluorinated benzene rings.

In accordance with alternative embodiments of the present invention, stabilization of the non-calamitic liquid crystal molecules 110 may be accomplished by capturing the prepared substance between elastic substrates or by capturing the prepared substance within a pre-established polymer mesh. In such alternative embodiments, the non-calamitic liquid crystal molecules 10 themselves are not used to form the polymer mesh or matrix.

Furthermore, the basic device 100 may be scaled up to form a layered laminate product with multiple pairs of electrodes (e.g., interdigitized electrodes) to increase efficiency, in accordance with various embodiments of the present invention. An example is given later with respect to FIGS. 13A-13B.

Figure 5:
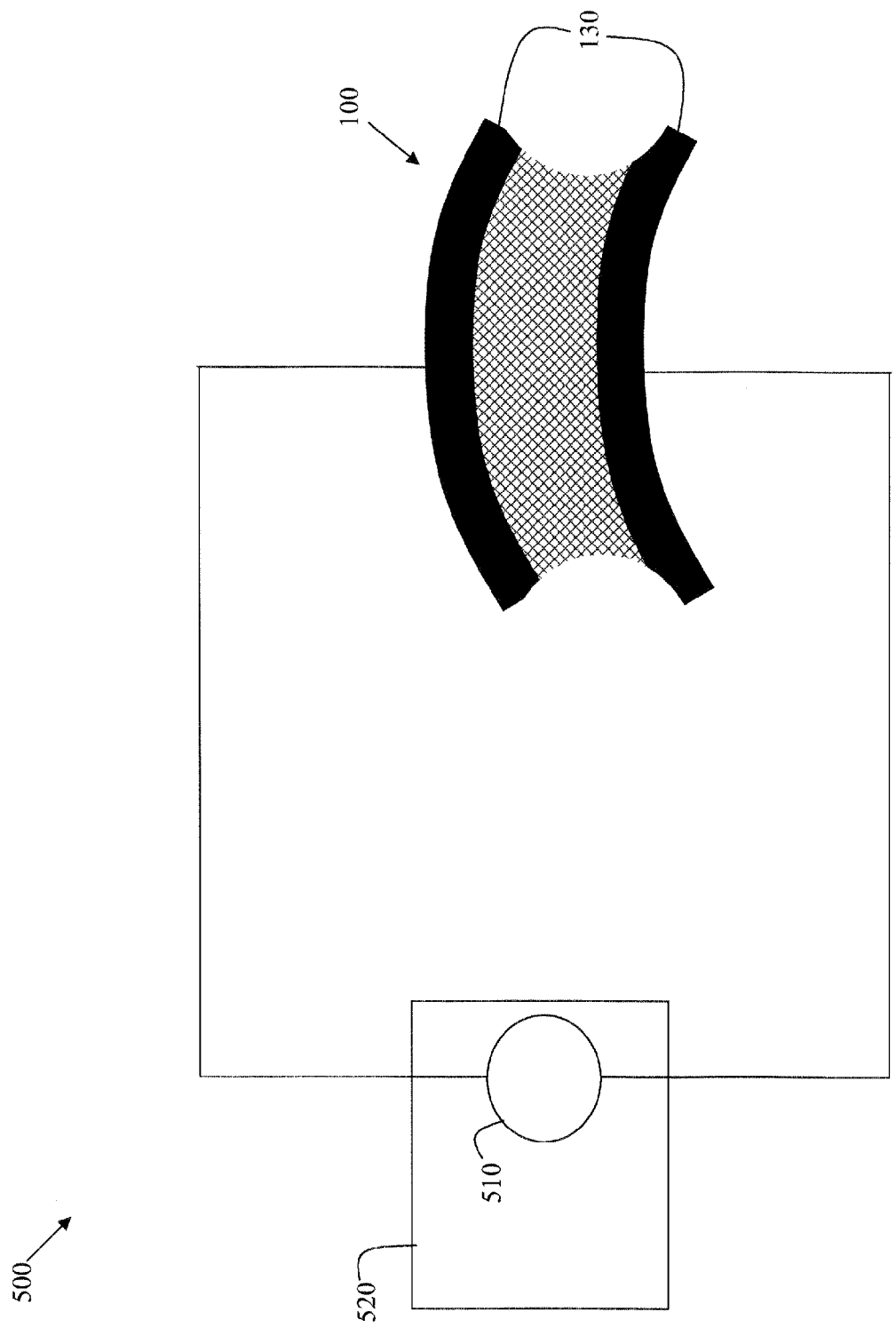
FIG. 5 is a schematic illustration of the energy conversion device of FIG. 1 used in a circuit powering application.

FIG. 5 is a schematic illustration of the energy conversion device 100 of FIG. 1 used in a circuit powering application. The electrodes 130 of the device 100 are connected to a rechargeable power cell 510 which is used to power a circuit 520. The power cell 510 may be a re-chargeable battery or some other type of re-chargeable power pack. The circuit 520 may be any type of electrical circuit which may be powered by the power cell 510. For example, the circuit 520 may comprise an MP3 player, a small flashlight, a cell phone, a radio, or any other type of device having a power cell 510 that may be re-charged.

When the device 100 is mechanically flexed (e.g., by a human), a potential difference (voltage) is created at the electrodes 130. By applying the potential difference (voltage) to the power cell 510, the power cell 510 is re-charged over time. The device 100 may be integrated into, for example, a person's clothing (e.g., a shirt) such that, when a person moves around in the normal course of daily activity, the device 100 is flexed and the power cell 510 is re-charged over time as a result of the giant flexoelectric effect. The combination of the circuit 520, power cell 510, and the flexoelectric device 100 may be considered a closed circuit electro-mechanical energy conversion device or system 500. Many other applications of the device 500 are possible as well, in accordance with various embodiments of the present invention.

Figure 6:
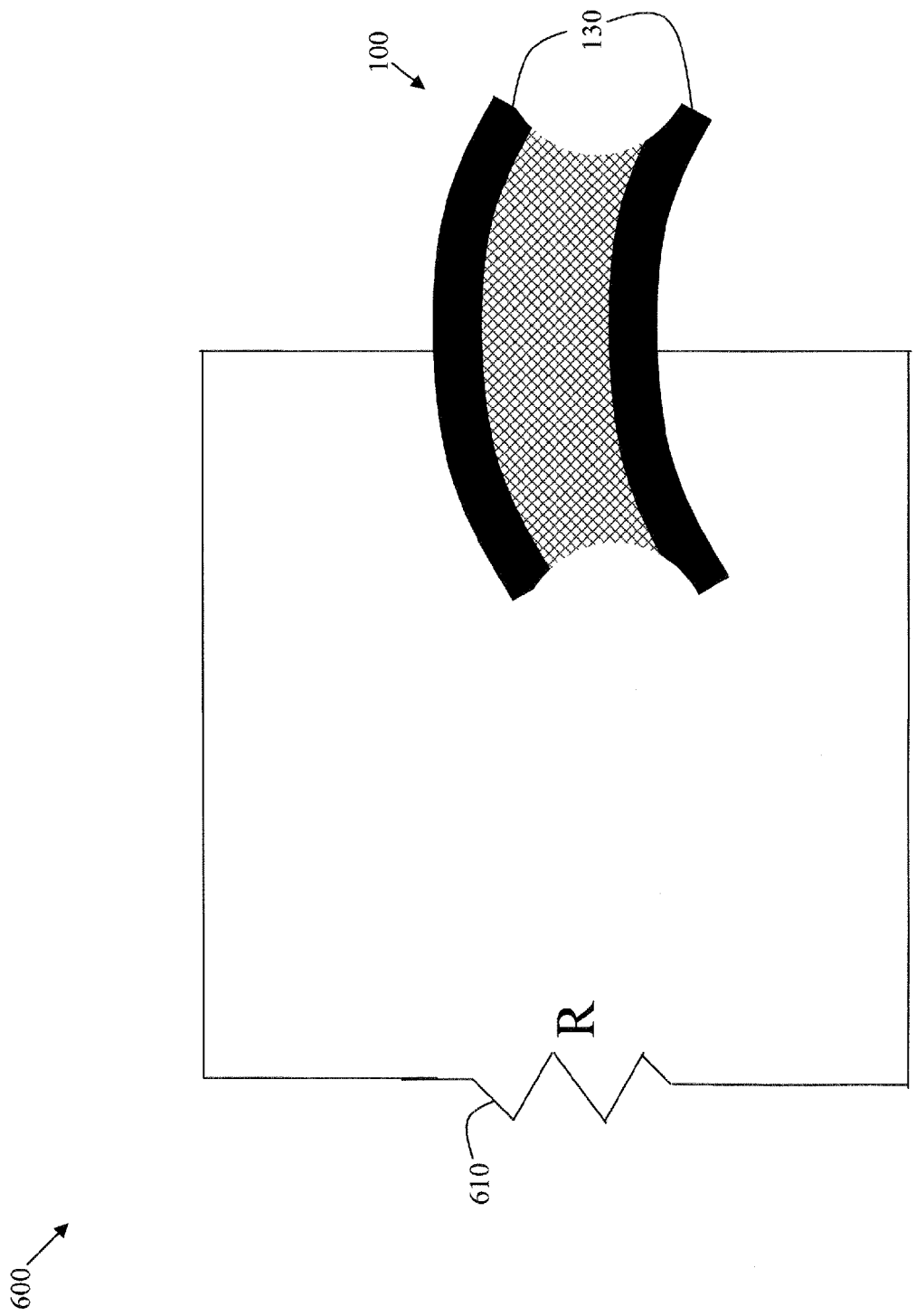
FIG. 6 is a schematic illustration of the energy conversion device of FIG. 1 used in an energy dissipating application.

FIG. 6 is a schematic illustration of the energy conversion device 100 of FIG. 1 used in an energy dissipating application. The device 100 is electrically connected to a simple resistive load 610. When the device 100 is flexed, a current is induced in the load and the mechanical energy flexing the device 100 is converted to electrical energy which is dissipated by the load 610. By varying the load 610, the amount of mechanical energy converted may be varied. The energy is dissipated by the resistive load 610 and is no longer available to do mechanical work. Thus, the device 600 functions as a mechanical energy dissipator which may be used in applications such as vibration damping, for example.

The combination of the resistive load 610 and the flexoelectric device 100 may be considered a closed circuit electro-mechanical energy conversion device or system 600. For example, if a plurality of the devices 600 are integrated into clothing, such clothing may be used to help keep a person warm as they move around in the course of their daily activities since the electrical energy absorbed by the resistive load may be given off as thermal energy (heat). Many other applications of the device 600 are possible as well, in accordance with various embodiments of the present invention.

Figure 7:
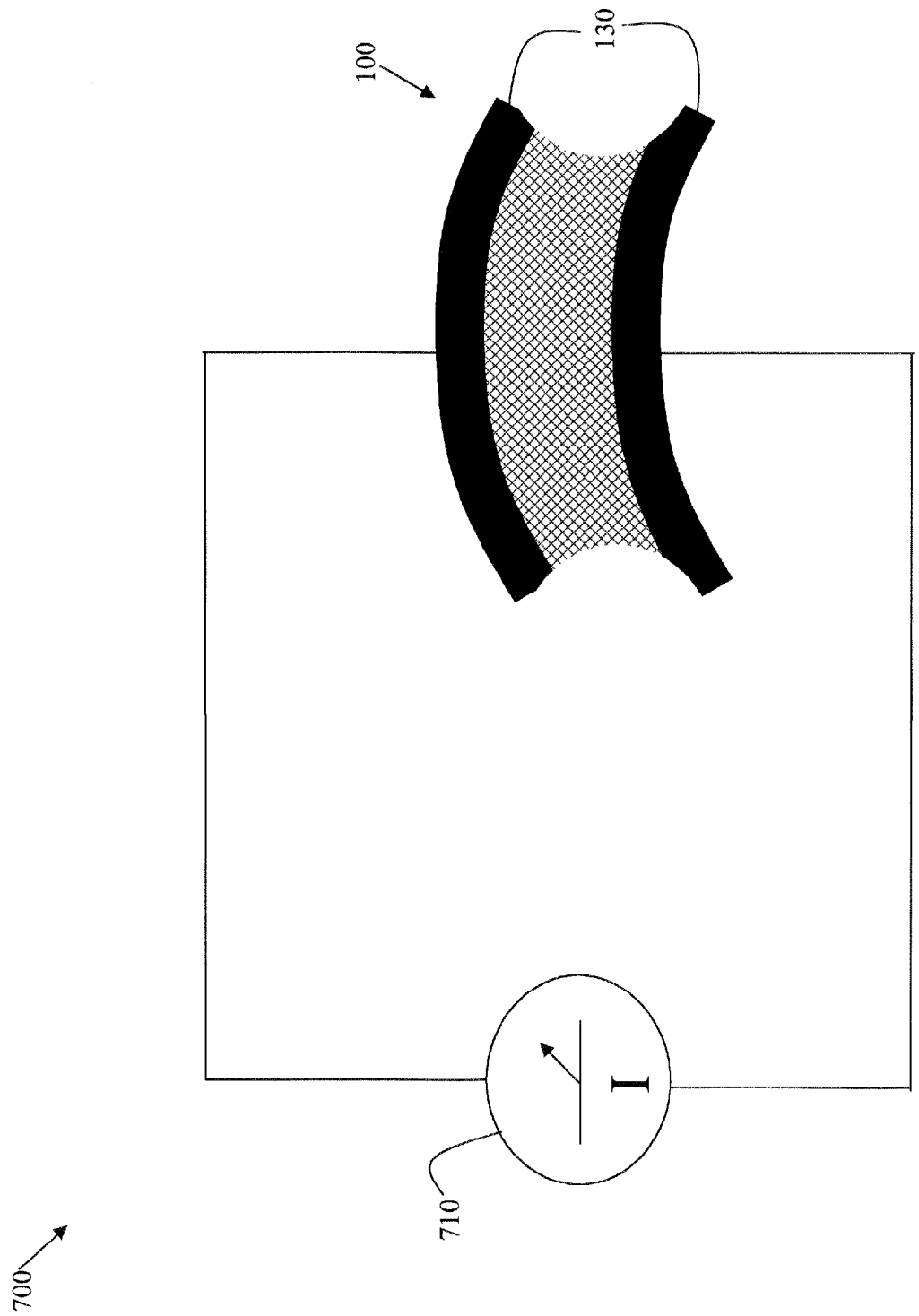
FIG. 7 is a schematic illustration of the energy conversion device of FIG. 1 used in a sensing/transducing application.

FIG. 7 is a schematic illustration of the energy conversion device 100 of FIG. 1 used in a sensing/transducing application. The device 100 is electrically connected to a sensitive current detector 710 such as a galvanometer. When the device 100 is flexed, even by a small amount, a measurable current registers in the detector 710 as a result of the flexure. The combination of the current detector 710 and the flexoelectric device 100 may be considered a closed circuit electro-mechanical energy conversion device or system 700. Therefore, the closed circuit device 700, comprising the detector 710 and the flexoelectric device 100, functions as a sensitive sensor/transducer for the detection of very small flexures or displacements which cause flexures. Such a device 700 may be used, for example, to monitor small critical flexures in implantable medical devices. Many other applications of the device 700 are possible as well, in accordance with various embodiments of the present invention.

Figure 8:
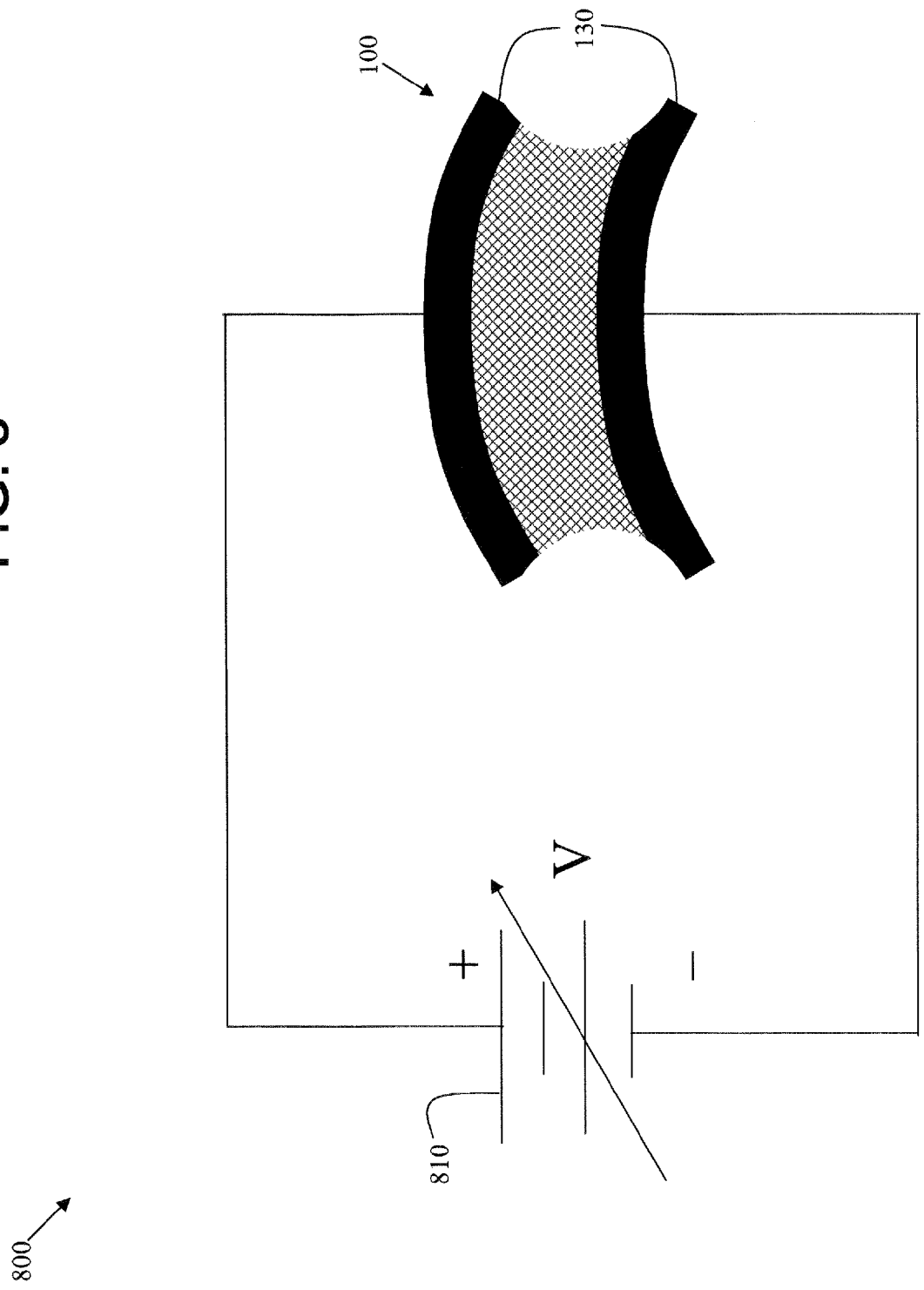
FIG. 8 is a schematic illustration of the energy conversion device of FIG. 1 used in an actuating application.

FIG. 8 is a schematic illustration of the energy conversion device 100 of FIG. 1 used in an actuating application. In such an embodiment 800, the device 100 acts in a reverse mode. That is, instead of converting mechanical energy into electrical energy, the reverse occurs. When a source of electrical potential difference (voltage) 810 is applied across the flexoelectric device 100, flexure is induced in the device 100. Therefore, the device 100 functions as an electrically controlled mechanical actuator. The combination of the voltage source 810 and the flexoelectric device 100 may be considered a closed circuit electro-mechanical energy conversion device or system 800. Such a device 800 may be used, for example, to steer a beam of light if one side of the flexoelectric device 100 is made to be reflective to light. The voltage source 810 may be a variable or adjustable voltage source, in accordance with an embodiment of the present invention. Many other applications of the device 800 are possible as well, in accordance with various embodiments of the present invention.

Further, applications of the flexoelectric device 100 other than energy conversion, energy dissipation, sensing/transducing, and actuating may be possible as well. Wearable products such as, for example, patches on joints (knees, fingers, elbows, etc.) or in footwear that generate electrical energy from mechanical work involved in routine life activities (e.g., walking, running, typing, etc.) are possible with the giant flexoelectric effect. The patches may be light weight and soft and, therefore, would not burden the user. The inverse effect of converting electrical energy to mechanical work may be employed in robotics applications and optical beam steering applications, for example. Designs that work based on pressure such as, for example, dielectric heel-strike generators are possible as well.

Figure 9A:
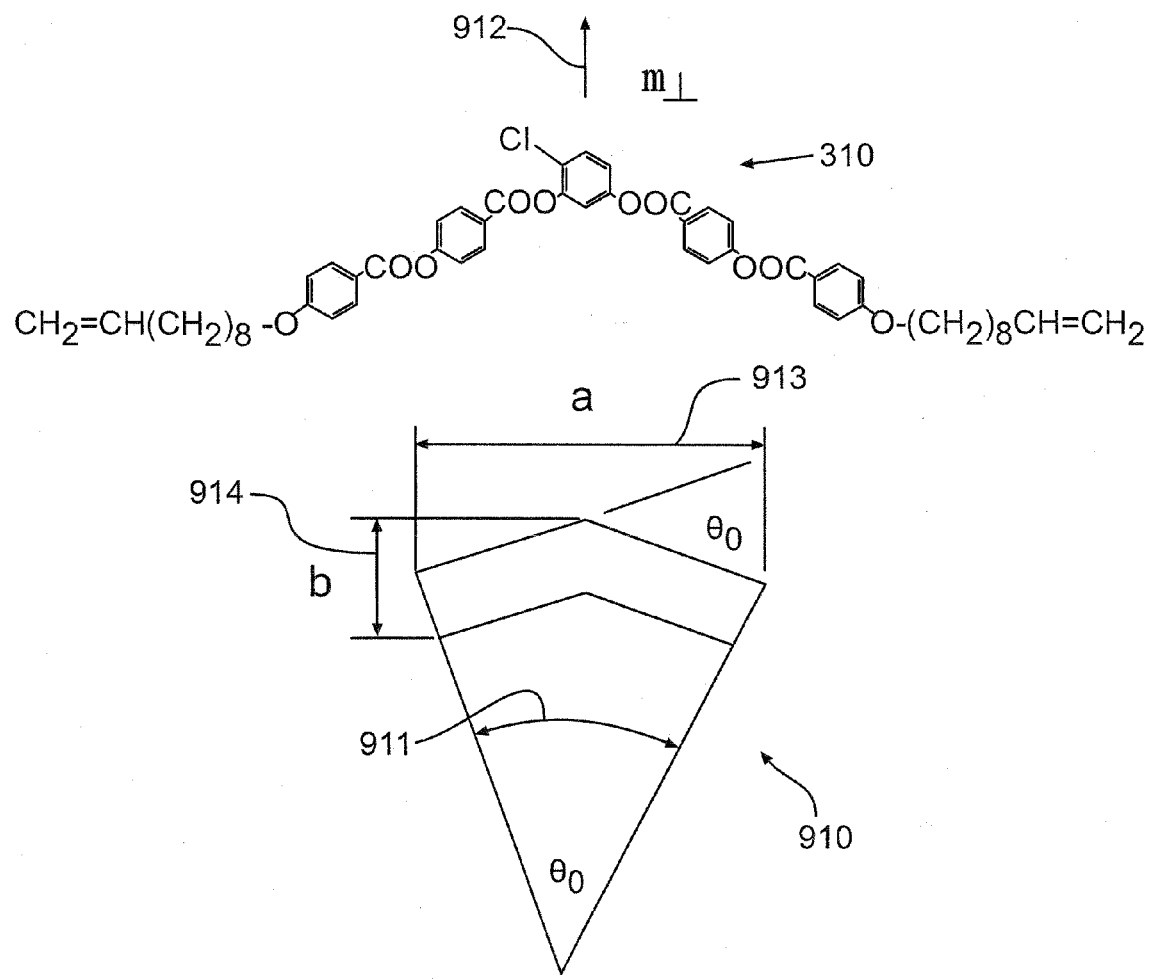
FIG. 9A is a chemical illustration of the non-calamitic nematic liquid crystal molecule of FIG. 3A along with a schematic representation of its simplified geometrical model.

The ability to directly and accurately measure the giant flexoelectric effect for different types of non-calamitic liquid crystal molecules is important for identifying molecules that will be effective for particular applications. FIG. 9A is a chemical illustration of the non-calamitic nematic liquid crystal molecule 310 of FIG. 3A along with a schematic representation of its simplified geometrical model 910. A flexoelectric polarization, $P_f$, may arise in a normally apolar NLC when the average direction for orientational order or director, $\hat{n}$, is subjected to splay or bend deformations. The effect is enhanced for molecules which possess a permanent dipole moment and shape anisotropies, for example, non-calamitic NLC molecules such as pear-shaped or banana-shaped molecules. In such cases, orientationally deformed structures having nonzero $P_f$ have both closer molecule packing and lower free energy than non-polar arrangements. In the continuum limit, $P_f$ is proportional to the first order spatial derivatives of $\hat{n}$. Higher order derivatives are negligible when the deformation length scale is small compared to the molecular size. The flexoelectric polarization of a standard uniaxial nematic may then be expressed in terms of two flexoelectric coefficients $e_1$ and $e_3$, corresponding to splay and bend deformations, respectively:

$$P_f = e_1 \hat{n}(\text{div } \hat{n}) + e_3 (\text{curl } \hat{n}) \times \hat{n}. \tag{1}$$

A molecular statistical approach to estimate the flexoelectric coefficients predicts that the bend flexoelectric constant $e_3$ of a banana shaped molecule may be related to the kink angle $\theta_o$ 911 in the molecular core:

$$e_3 = \frac{\mu_\perp K_{33}}{2 k_b T} \theta_o \left(\frac{b}{a}\right)^{\frac{2}{3}} N^{\frac{1}{3}} \tag{2}$$

In equation (2), $\mu_\perp$ 912 is the molecular dipole perpendicular to the molecular long axis; 'a' 913 and 'b' 914 are the length and width of a molecule, T is the absolute temperature, N is the number density of the molecules, and $K_{33}$ is the bend elastic constant. This approach assumes that the molecules fluctuate independently. For rod-shaped molecules, $\theta_o < 1°$, and the flexoelectric coefficients of such NLCs are estimated to be 1-10 pC/m, in reasonable agreement with measured values. For typical banana-shaped molecules, $\theta_o \sim 60°$ and, therefore, it is expected that such bent core NLC molecules have an $e_3$ being about 100 times larger.

A method for measuring the flexoelectric coefficient is directly based on the definition of equation (1). An oscillatory bend deformation is induced by periodically flexing a thin layer of liquid crystal material contained between non-rigid conducting surfaces. The induced current is then measured. An exemplary embodiment of a NLC sample includes 150 μm thick polycarbonate sheets, used as flexible substrates, with indium tin oxide (ITO) conductive coating sputtered onto the inner surfaces. The inner surfaces have been spin-coated with a polyimide layer which has been rubbed unidirectionally to achieve uniform planar alignment of the LC director. Bent-core NLC samples (CLPbis10BB) being 20 μm thick, have been loaded into cells constructed from the substrates.

Figure 9B:
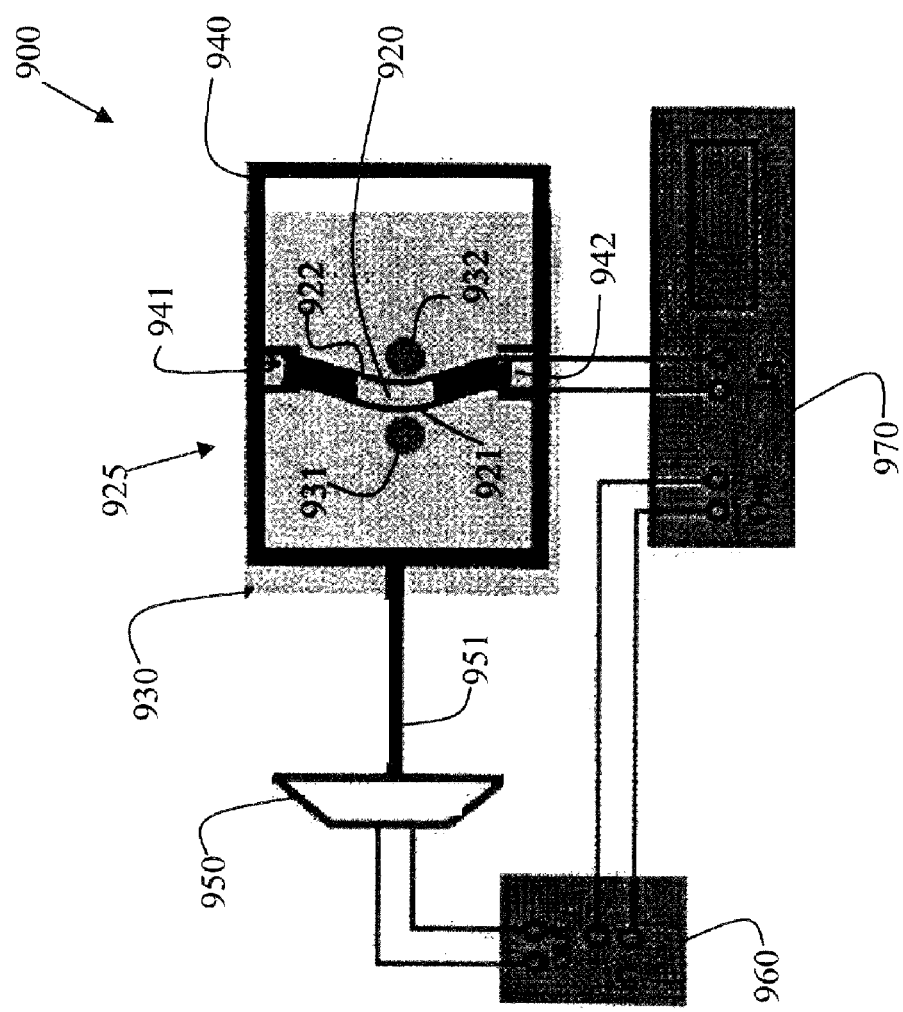
FIG. 9B is a schematic illustration of a first embodiment of a system for determining a flexoelectric effect in a liquid crystal material.

FIG. 9B is a schematic illustration of a first embodiment of a system 900 for determining a flexoelectric effect in a liquid crystal material 920. A liquid crystal sample 920 is placed in a test chamber 925 having a fixed bottom plate or base 930 with two vertically oriented cylindrical posts 931 and 932, and movable side walls 940 having vertical slots 941 and 942. The liquid crystal sample 920 is confined between flexible electrodes 921 and 922 and is inserted between the slots 941 and 942 and the cylindrical posts 931 and 932 as shown in FIG. 9B.

Flexing of the liquid crystal sample 920 is achieved by periodically translating the side walls 940 using a vibrating driving mechanism 950 (e.g., an audio speaker or Skotch Yoke) capable of providing periodic motion and which is mechanically coupled to the moveable side walls 940 via a rod 951 or some other coupling means. The driving mechanism 950 is driven by an amplifier 960 electrically coupled to the driving mechanism 950 to electrically drive the driving mechanism 950. A signal generator and a current sensor, shown as an integrated lock-in amplifier 970 in FIG. 9B, are provided. The signal generator is electrically coupled to the amplifier 960 to provide a signal of at least one audio frequency to the amplifier 960, and the current sensor is electrically coupled to the flexible electrodes 921 and 922 to measure an induced current in the liquid crystal sample material 920 mechanically coupled to the moveable side walls 940 of the test chamber 925. During operation of the system 900, the walls 940 of the test chamber 925 oscillate and the liquid crystal sample 920 flexes at the same frequency and amplitude as the driving mechanism 950. The electrodes 921 and 922 of the liquid crystal sample 920 are connected to the current input of the lock-in amplifier 970 (current sensor portion) such that the precision with which the electric polarization current may be measured using this technique is a few pico-amps (pA).

Figure 10A:
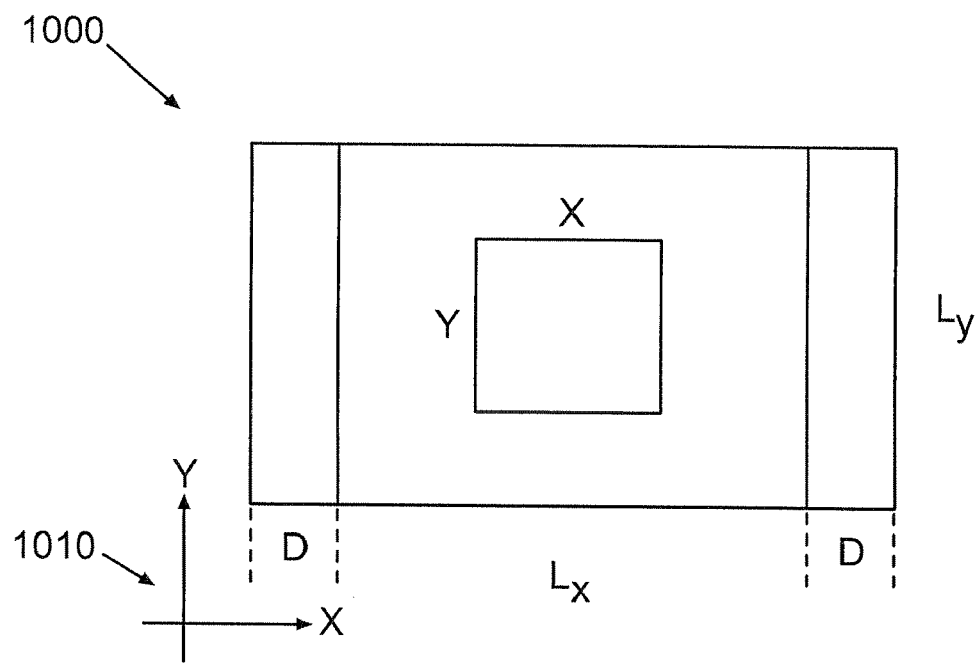
FIG. 10A is a schematic illustration of an embodiment of a model of the sample cell geometry of a nematic liquid crystal material.

FIG. 10A is a schematic illustration of an embodiment of a model of the sample cell geometry 1000 of a nematic liquid crystal material 920. The cell 1000 of total length $L_x+2D$ and width $L_y$ is initially located in the x-y plane 1010 and the mechanical displacement occurs along the direction of the z-axis 1020. The cell 1000 is symmetric with respect to its center and, therefore, the deformation profile of the substrates is given by an even function $Z(x)$. The current induced by the flexoelectric polarization is $$I = \frac{d}{dt}\int\int P_f dA,$$

where dA is the surface area element and the integration extends over the whole active area (X×Y) of the cell 1000. In the planar geometry, only the bend term contributes. Therefore, after integration, $$I = e_3 Y \frac{d}{dt}[n_z(x = X/2) - n_z(x = -X/2)].$$

Figure 10B:
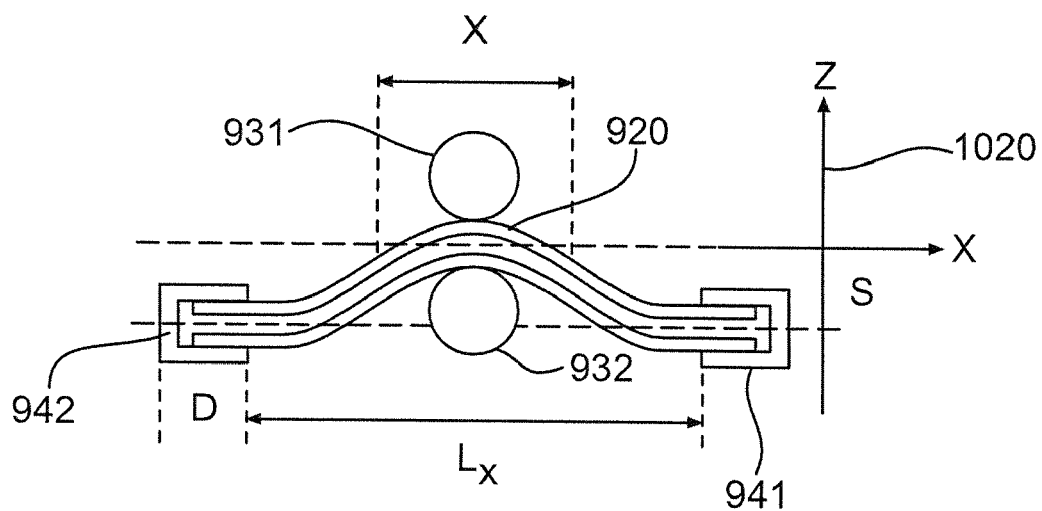
FIG. 10B is a schematic illustration of an embodiment of the nematic liquid crystal material of FIG. 10A during deformation using the system of FIG. 9B.

In the case of the small deformations considered, $n_z$ corresponds to the tangent of the substrates, that is $$n_z(x) = \frac{\partial Z(x)}{\partial x},$$

where $Z(x)$ describes the displacement of the substrates and the sample. FIG. 10B is a schematic illustration of an embodiment of the nematic liquid crystal material 920 of FIG. 10A during deformation using the system 900 of FIG. 9B. The mechanical deformation corresponds to the classical problem of bending an elastic sheet found in standard texts and reveals that $Z(x)=S\beta(x)$, where $$\beta(x) = \frac{1}{4}\left[3\left(\frac{2x}{L_x}\right)^2 - \left(\frac{2x}{L_x}\right)^3\right]. \quad (3)$$

Therefore, taking into account that the direction is fixed at the edges by the slots 941 and 942, the flexoelectric current becomes $$I = e_3 Y \frac{dS}{dt}\frac{d\beta}{dx}\Big|_{-X/2}^{X/2}$$

$$= e_3 Y \frac{dS}{dt}\frac{6X}{L_x^2}.$$

With periodic flexing ($S=S_o \sin \omega t$, where $S_o$ is the peak displacement and $\omega$ is the frequency of oscillation), the flexoelectric coefficient may then be determined in terms of the root-mean-square (rms) induced current $I_{rms}$ as $$|e_3| = \frac{\sqrt{2} I_{rms}}{6X \omega S_o}\frac{L_x^2}{Y} \quad (4)$$

Figure 11:
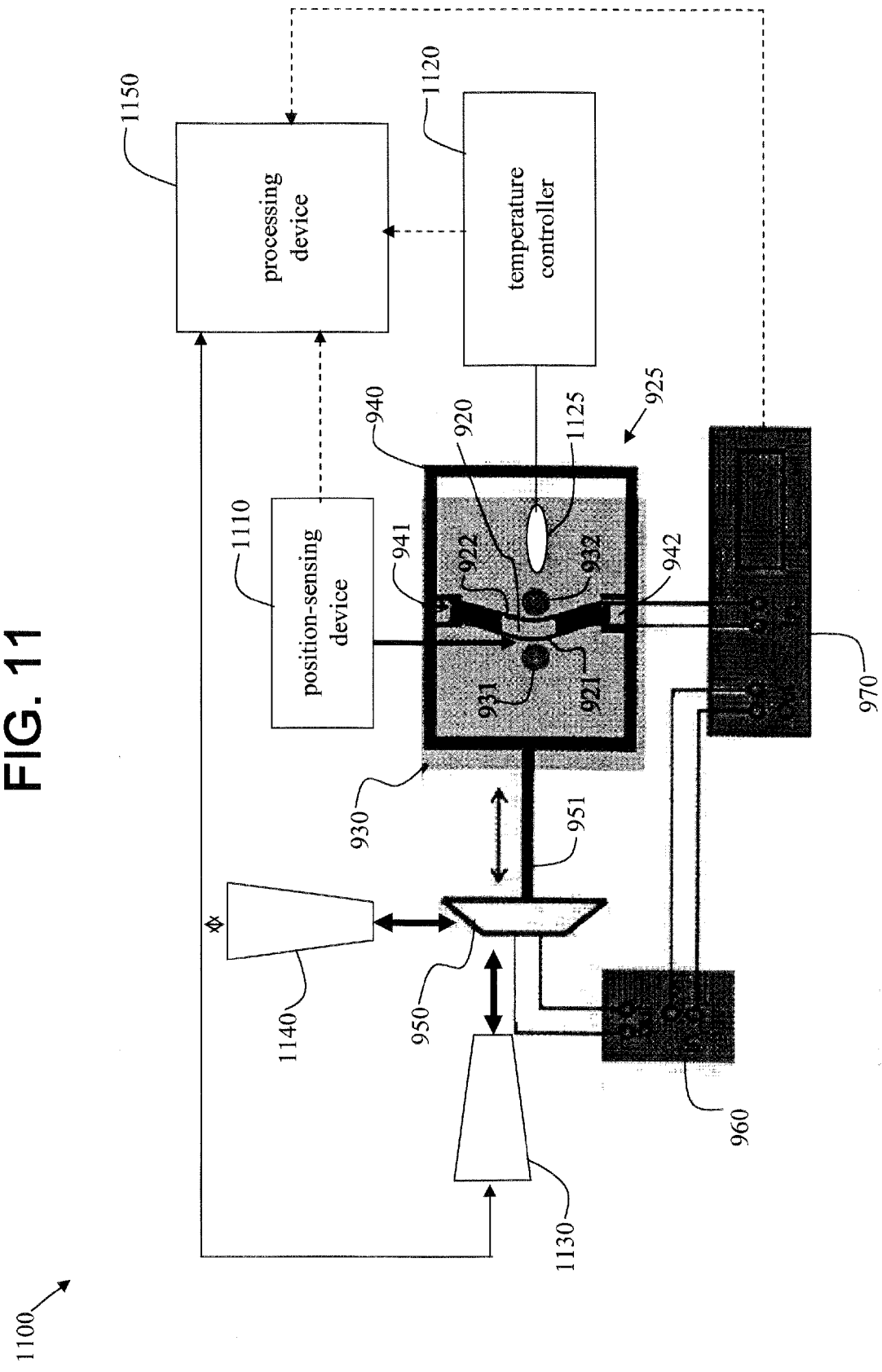
FIG. 11 is a schematic illustration of a second embodiment of a system for determining a flexoelectric effect in a liquid crystal material.

FIG. 11 is a schematic illustration of a second embodiment of a system 1100 for determining a flexoelectric effect in a liquid crystal material 920. The system 1100 is similar to the system 900 of FIG. 9B but has additional components. In order to achieve smooth and uniform motion, the position of the driving mechanism 950 with respect to the moveable side walls 940 is critical and, therefore, may be adjusted using two perpendicular micro-positioners 1130 and 1140. The micro-positioners may comprise micro-electric actuators or micro-fluidic actuators, for example. In accordance with an embodiment of the present invention, the micro-positioners 1130 and 1140 are controlled by a processing device or controller 1150 which may comprise, for example, a personal computer (PC) or a programmable logic controller (PLC).

The amplitude (e.g., peak deformation) and/or frequency of the applied oscillatory deformation may be measured with 0.2 mm precision by a position-sensing device 1110 either by, for example, mechanical detection or my measuring the intensity of a laser diode through a neutral optical gradient filter fixed to the moving rod connecting the test chamber 925 to the driving mechanism 950.

The test chamber 925 may be enclosed and may be temperature regulated, in accordance with an embodiment of the present invention. A temperature controller 1120 may be used to regulate the temperature of the test chamber 925 with, for example, a precision of $\Delta T<1°$ C. between room temperature and 160° C. A temperature sensor 1125 connected with the temperature controller 1120 indicates to the temperature controller 1120 the present temperature inside the test chamber 925, such that the temperature controller 1120 may regulate the temperature of the test chamber 925 in response to the present temperature. The temperature controller 1120 may include a fan, an air conditioner, a heater, or any combination thereof. Other temperature controllers are possible as well, in accordance with various embodiments of the present invention.

The processing device 1150 may be used to calculate at least one flexoelectric coefficient (e.g., $e_3$) in response to at least one of the measured induced electric current, the measured peak deformation, and the frequency of oscillation. The processing device 1150 may comprise a hand-held calculator, where all calculations are performed manually by an operator, or a programmable computer-based device such as a PC, where calculations are performed automatically in response to inputs received from at least one of the lock-in amplifier 970, the micro-positioners 1130 and 1140, the position-sensing device 1110, and the temperature controller 1120.

Figure 12:
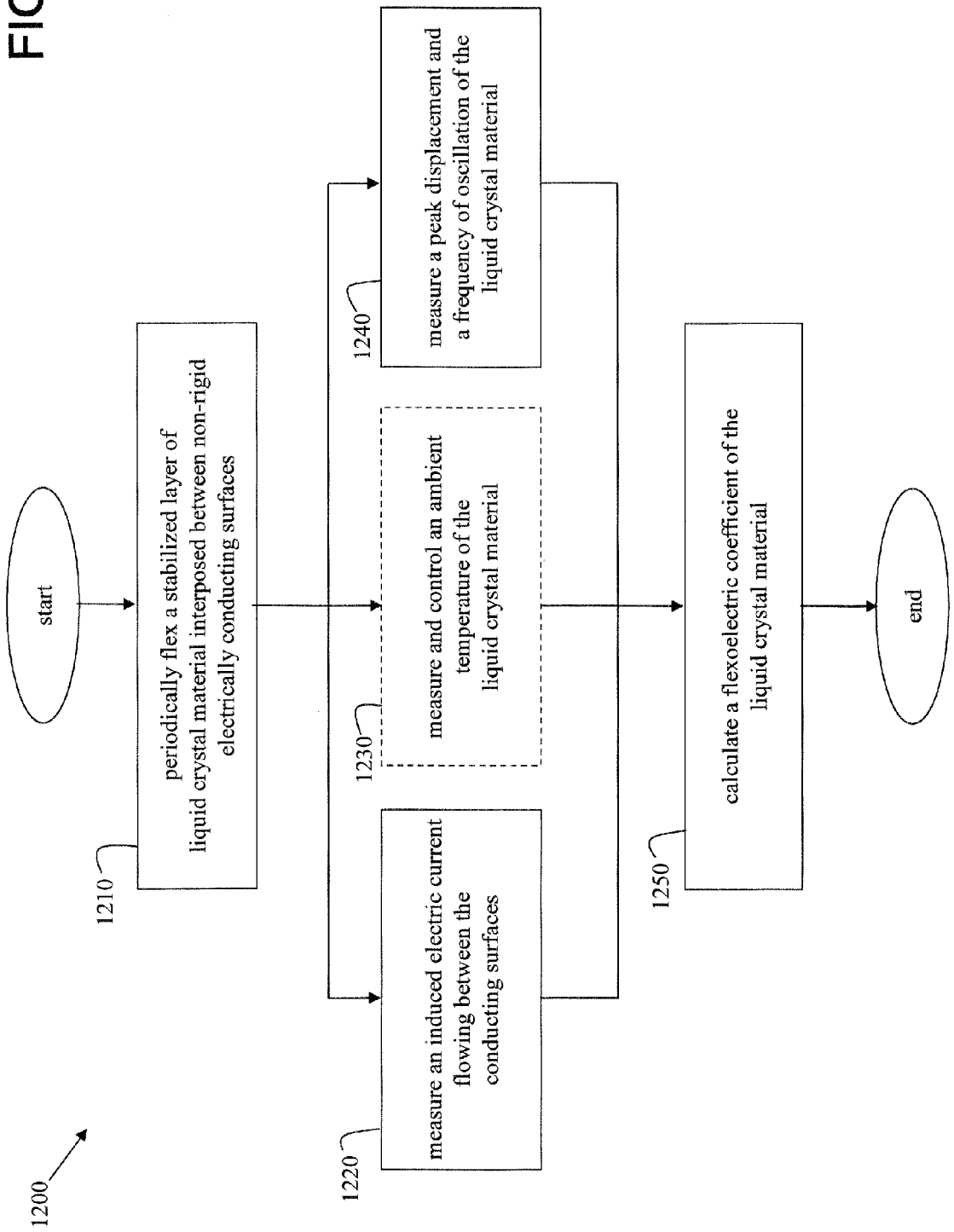
FIG. 12 is a flowchart of an embodiment of a method for determining a flexoelectric effect in a liquid crystal material using the system of FIG. 9B or the system of FIG. 11.

FIG. 12 is a flowchart of an embodiment of a method 1200 for determining a flexoelectric effect in a liquid crystal material using the system 900 of FIG. 9B or the system 1100 of FIG. 11. In step 1210, periodically flex a stabilized layer of liquid crystal material interposed between non-rigid electrically conducting surfaces. In step 1220, measure an induced electric current flowing between the conducting surfaces. In step 1230, measure and control an ambient temperature of the liquid crystal material (this step is optional). In step 1240, measure a peak displacement and a frequency of oscillation of the liquid crystal material. In step 1250, calculate a flexoelectric coefficient of the liquid crystal material in response to at least one of the measured induced current, the measured peak displacement, and the frequency of oscillation.

The periodic flexing is a result of inducing an oscillatory bend deformation in the layer of liquid crystal material in response to the periodic driving mechanism (e.g., a vibrating speaker cone). The ambient temperature of the liquid crystal material is controlled by controlling the temperature inside the test chamber 925.

Figure 13B:
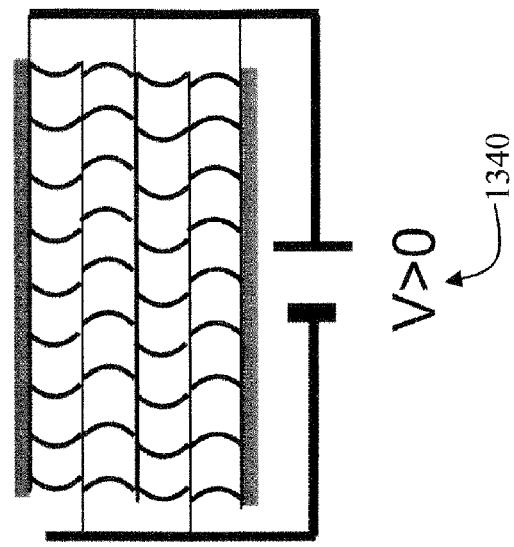
FIGS. 13A-13B are schematic illustrations of an embodiment of an energy conversion device having interdigitated electrodes.
Figure 13A:
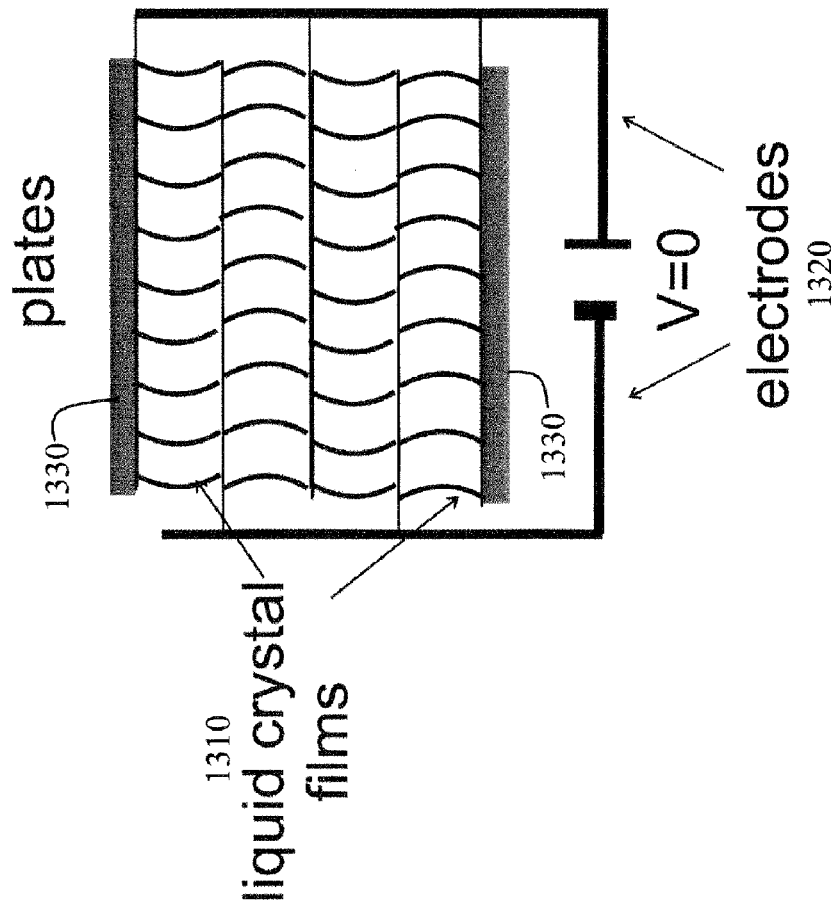

In accordance with other embodiments, the basic device 100 may be rolled up or stacked up with electrodes in parallel circuits, or by using interdigitated electrodes to increase efficiency. FIG. 13A shows an exemplary embodiment of a stacked, interdigitated configuration 1300 in an unbent or uncompressed state. FIG. 13B shows the stacked configuration 1300 in a bent or compressed state. The configuration 1300 includes layers of liquid crystal material or film 1310 in between fingers of electrodes 1320 (interdigitized electrodes). In such a configuration 1300, the interdigitized electrodes 1320 may be rigid. When the external plates or substrates 1330 are pressed, the liquid crystal material 1310 is bent or flexed between the electrodes 1320 and exhibits the giant flexoelectric effect, thus creating a non-zero voltage 1340 at the output of the electrodes 1320. Similarly, if a voltage is applied to the electrodes 1320, the configuration 1300 becomes compressed.

In summary, devices and methods for energy conversion based on the giant flexoelectric effect in non-calamitic liquid crystals are disclosed. By preparing a substance comprising at least one type of non-calamitic liquid crystal molecules and stabilizing the substance to form a mechanically flexible material, flexible conductive electrodes may be applied to the material to create an electro-mechanical energy conversion device which relies on the giant flexoelectric effect to produce electrical and/or mechanical energy that is usable in such applications as, for example, power sources, energy dissipation, sensors/transducers, and actuators. The ability to directly and accurately measure the giant flexoelectric effect for different types of non-calamitic liquid crystal molecules is important for identifying molecules that will be effective for particular applications.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method of creating an electro-mechanical energy conversion device, said method comprising:
    preparing a substance comprising at least one type of liquid crystalline material with molecules having a non-calamitic shape;
    stabilizing said prepared substance to form a mechanically flexible material; and
    applying at least one conductive electrode to said mechanically flexible material.

2. The method of claim 1 further comprising at least two conductive electrodes and connecting said at least two electrodes with an electrical device.

3. The method of claim 2 wherein the electrical device is selected from the group consisting of a circuit, a resistive load, a current detector, a source of electrical potential difference or combinations thereof.

4. The method of claim 1 wherein said stabilizing includes initiating cross-linking between two or more functional groups of said at least one type of liquid crystalline material with molecules having a non-calamitic shape to form a polymer matrix of covalent bonds.

5. The method of claim 1 wherein said preparing includes dissolving compounds having reactive functional groups within said liquid crystalline material with molecules having a non-calamitic shape.

6. The method of claim 5 wherein said stabilizing includes initiating cross-linking between said reactive functional groups to form a polymer matrix.

7. The method of claim 6 wherein said stabilizing includes initiating cross-linking between said reactive functional groups to form a polymer matrix of covalent bonds or hydrogen bonds.

8. The method of claim 1 wherein said stabilizing includes initiating cross-linking between two or more functional groups of said at least one type of non-calamitic liquid crystal molecules to form a polymer matrix of hydrogen bonds.

9. The method of claim 1 wherein said stabilizing includes capturing said substance between elastic substrates.

10. The method of claim 1 wherein said stabilizing includes capturing said substance within a pre-established polymer mesh.

11. The method of claim 1 further comprising aligning said non-calamitic shaped liquid crystal molecules, before stabilizing said substance, such that a direction of average molecular anisotropy in an undistorted state is substantially uniform across the molecules.

12. The method of claim 11 wherein said aligning is accomplished by at least one of surface treatment, mechanical deformation, external electric fields, and external magnetic fields.

13. The method of claim 1 wherein said non-calamitic shaped liquid crystal molecules comprise bent-core liquid crystal molecules.

14. The method of claim 1 wherein a liquid crystal phase of said non-calamitic liquid shaped crystal molecules is nematic.

15. The method of claim 1 wherein said non-calamitic shaped liquid crystal molecules are capable of exhibiting giant flexoelectricity.

16. A method of creating an electro-mechanical energy conversion device, said method comprising:
    preparing a substance comprising at least one type of liquid crystalline material with molecules having a non-calamitic shape and capable of exhibiting a giant flexoelectric effect;
    stabilizing said prepared substance to form a mechanically flexible material; and
    applying at least one conductive electrode to said mechanically flexible material.

17. A method of creating an electro-mechanical energy conversion device comprising:
    preparing a substance comprising at least one type of non-calamitic liquid crystal molecules;
    stabilizing said prepared substance to form a mechanically flexible material, wherein the mechanically flexible material comprises a polymer matrix;
    applying at least one conductive electrode to said material, wherein mechanical flexing of the mechanically flexible material generates electrical energy which is received by the at least one electrode.

18. The method as in claim 17, wherein the polymer matrix is comprised of bonds selected from the group consisting of covalent bonds between two or more functional groups of reactive compounds dissolved in the non-calamitic liquid crystal molecules before the substance as stabilized, covalent bonds between two or more functional groups of the at least one type of non-calamitic liquid crystal molecules hydrogen bonds between two or more functional groups of the at least one type of non-calamitic liquid crystal molecules, hydrogen bonds between two or more functional groups of reactive compounds dissolved in the non-calamitic liquid crystal molecules before the substance is stabilized or combinations thereof.

* * * * *